US012776766B2

(12) United States Patent
Taghivand et al.

(10) Patent No.: US 12,776,766 B2
(45) Date of Patent: Oct. 27, 2026

(54) SYSTEMS AND TECHNIQUES FOR MAGNETIC FIELD CANCELLATION FOR A RADIO ARCHITECTURE

(71) Applicant: QUALCOMM Incorporated, San Diego, CA (US)

(72) Inventors: Mazhareddin Taghivand, San Jose, CA (US); Sang Oh Lee, Cupertino, CA (US); Shinwoong Park, Sunnyvale, CA (US); Ayse Yesilyurt, San Jose, CA (US); Doohwan Jung, Fremont, CA (US); Rupal Gupta, San Jose, CA (US); Hongbing Wu, Saratoga, CA (US); Yukeun Sim, Los Gatos, CA (US); Jingang Piao, Sunnyvale, CA (US)

(73) Assignee: Qualcomm Incorporated, San Diego, CA (US)

( * ) Notice: Subject to any disclaimer, the term of this patent is extended or adjusted under 35 U.S.C. 154(b) by 587 days.

(21) Appl. No.: 18/296,505

(22) Filed: Apr. 6, 2023

(65) Prior Publication Data

US 2024/0339994 A1 Oct. 10, 2024

(51) Int. Cl.
*H03K 5/00* (2006.01)
*H03D 7/00* (2006.01)
*H04B 1/40* (2015.01)

(52) U.S. Cl.
CPC .......... *H03K 5/00006* (2013.01); *H03D 7/00* (2013.01); *H04B 1/40* (2013.01)

(58) Field of Classification Search
CPC .... H03B 27/00; H03B 5/1228; H03B 5/1296; H03D 7/00; H03K 5/00006; H04B 1/40; H04B 15/04
See application file for complete search history.

(56) References Cited

U.S. PATENT DOCUMENTS

| | | | | |
|---|---|---|---|---|
| 7,242,274 | B2 * | 7/2007 | Terrovitis | H03H 7/0115 336/200 |
| 9,118,289 | B1 * | 8/2015 | Fraley | H03F 9/00 |
| 10,749,468 | B1 * | 8/2020 | Park | H10D 1/20 |
| 10,855,225 | B1 * | 12/2020 | Taghivand | H04B 1/0057 |
| 2005/0195061 | A1 | 9/2005 | Terrovitis | |
| 2008/0074228 | A1 | 3/2008 | Erickson et al. | |
| 2011/0105072 | A1 | 5/2011 | Bhagat et al. | |

(Continued)

OTHER PUBLICATIONS

International Search Report and Written Opinion—PCT/US2024/017886—ISA/EPO—Jun. 11, 2024.

*Primary Examiner* — Nguyen T Vo
(74) *Attorney, Agent, or Firm* — Gerald P. Joyce, III

(57) ABSTRACT

Certain aspects of the present disclosure provide techniques and apparatus for generating oscillating signals and for wireless communication, such as a frequency synthesizer architecture using a step-symmetric inductor. An example frequency synthesizer generally includes an oscillator and a frequency adjustment circuit, an output of the oscillator being coupled to an input of the frequency adjustment circuit, the frequency adjustment circuit comprising a step-symmetric inductive element. An example transceiver generally includes the frequency synthesizer described herein, as well as a mixer having a local-oscillator (LO) input coupled to an output of the frequency adjustment circuit; and an amplifier coupled to the mixer.

23 Claims, 7 Drawing Sheets

(56) References Cited

U.S. PATENT DOCUMENTS

| | | | | |
|---|---|---|---|---|
| 2014/0191800 | A1* | 7/2014 | Jordan | H03F 3/195 330/190 |
| 2015/0349711 | A1 | 12/2015 | Han et al. | |
| 2017/0244361 | A1 | 8/2017 | Farazian et al. | |
| 2017/0345546 | A1* | 11/2017 | Armanious | H03B 15/00 |
| 2020/0098500 | A1* | 3/2020 | Terrovitis | H01F 17/0013 |

* cited by examiner

SYSTEMS AND TECHNIQUES FOR MAGNETIC FIELD CANCELLATION FOR A RADIO ARCHITECTURE

BACKGROUND

Field of the Disclosure

Certain aspects of the present disclosure generally relate to electronic components and, more particularly, to radio frequency front-end (RFFE) circuitry.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include a transceiver for processing signals for reception and/or transmission. A transceiver may include one or more transmit chains and one or more receive chains, which may include one or more amplifiers, one or more filters, and one or more mixers. The transceiver may also include one or more frequency synthesizers, which may include one or more tunable oscillators.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards a transceiver. The transceiver generally includes an oscillator and a frequency adjustment circuit, an output of the oscillator being coupled to an input of the frequency adjustment circuit, the frequency adjustment circuit comprising a step-symmetric inductive element.

Certain aspects of the present disclosure are directed towards a frequency synthesizer. The frequency synthesizer generally includes an oscillator and a frequency adjustment circuit, an output of the oscillator being coupled to an input of the frequency adjustment circuit, the frequency adjustment circuit comprising a step-symmetric inductive element.

Certain aspects of the present disclosure are directed towards a transceiver. The transceiver generally includes an oscillator and a frequency adjustment circuit, an output of the oscillator being coupled to an input of the frequency adjustment circuit, the frequency adjustment circuit comprising a first inductive element having a first inductive portion and a second inductive portion, wherein current is configured to flow in the first inductive portion in a first angular direction and in the second inductive portion in a second angular direction opposite to the first angular direction.

Certain aspects of the present disclosure are directed towards a frequency synthesizer. The frequency synthesizer generally includes an oscillator and a frequency adjustment circuit, an output of the oscillator being coupled to an input of the frequency adjustment circuit, the frequency adjustment circuit comprising a first inductive element having a first inductive portion and a second inductive portion, wherein current is configured to flow in the first inductive portion in a first angular direction and in the second inductive portion in a second angular direction opposite to the first angular direction.

Certain aspects of the present disclosure are directed towards a method for wireless communication. The method generally includes: generating a first oscillating signal having a first frequency; and generating, via a frequency adjustment circuit, a second oscillating signal having a second frequency greater than the first frequency, the frequency adjustment circuit comprising a step-symmetric inductive element.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure are directed towards a transceiver implemented using step-symmetric and dual-core structure inductive elements. The transceiver described herein addresses various challenges present in conventional transceivers, such as power consumption, generation of spurs (e.g., harmonic signal components), and voltage-controlled oscillator (VCO) and/or local oscillator (LO) pulling. Using step-symmetric and dual-core structure inductive elements facilitates a reduction of magnetic emissions (e.g., cancellation of magnetic fields), allowing for reduced noise associated with the transceiver. Moreover, the transceiver may be implemented using a zero-intermediate frequency (IF) and half-LO architecture, reducing power consumption.

Example Wireless Communications

Figure 1:
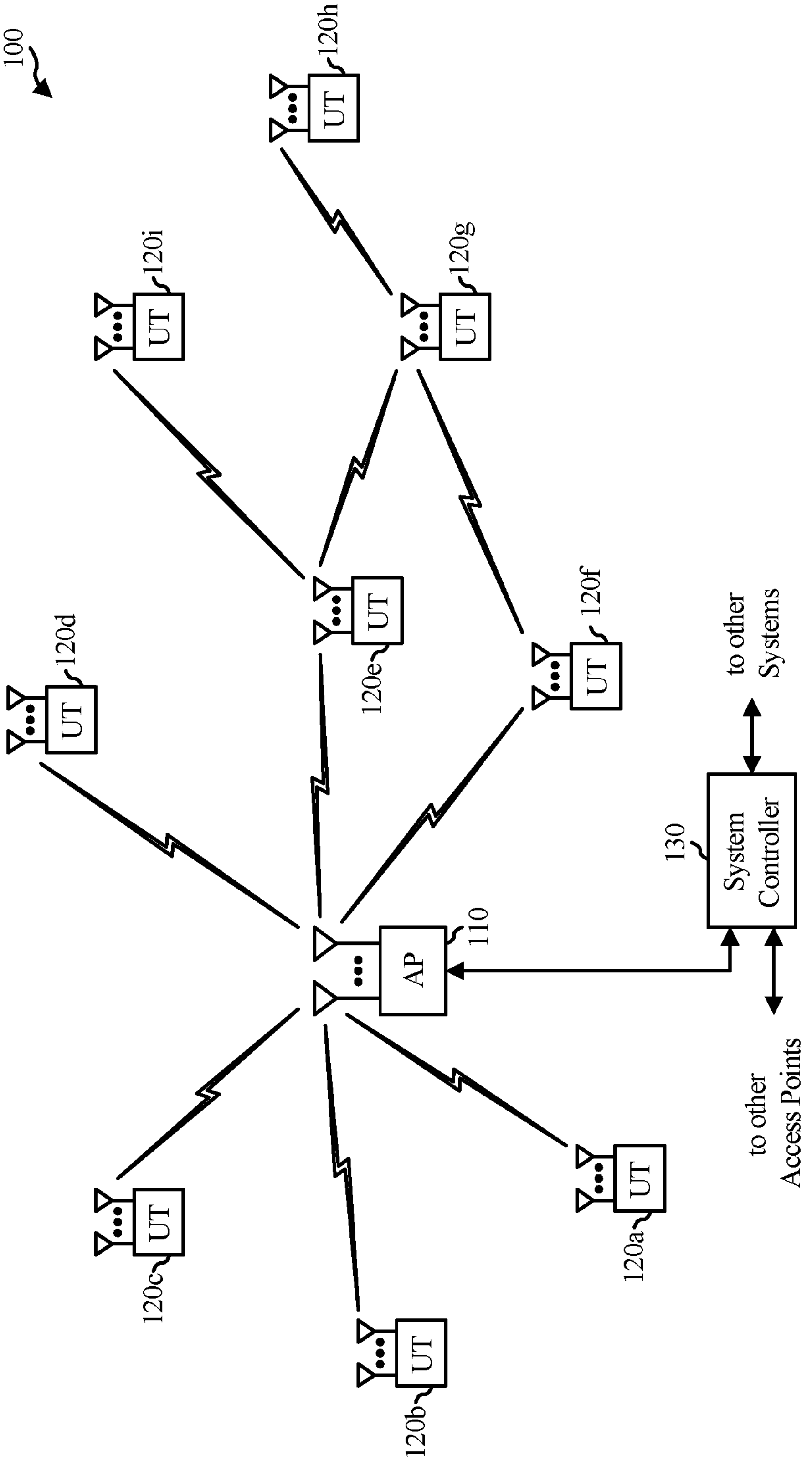
FIG. 1 is a diagram of an example wireless communications network, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set Nu of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The Nu selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported).

In some aspects, the user terminal 120 or access point 110 may include a frequency synthesizer implemented with an oscillator and a frequency doubler for generating a local-oscillator (LO) signal. The frequency doubler may be implemented with a step-symmetric inductive element, as described in more detail herein.

Figure 2:
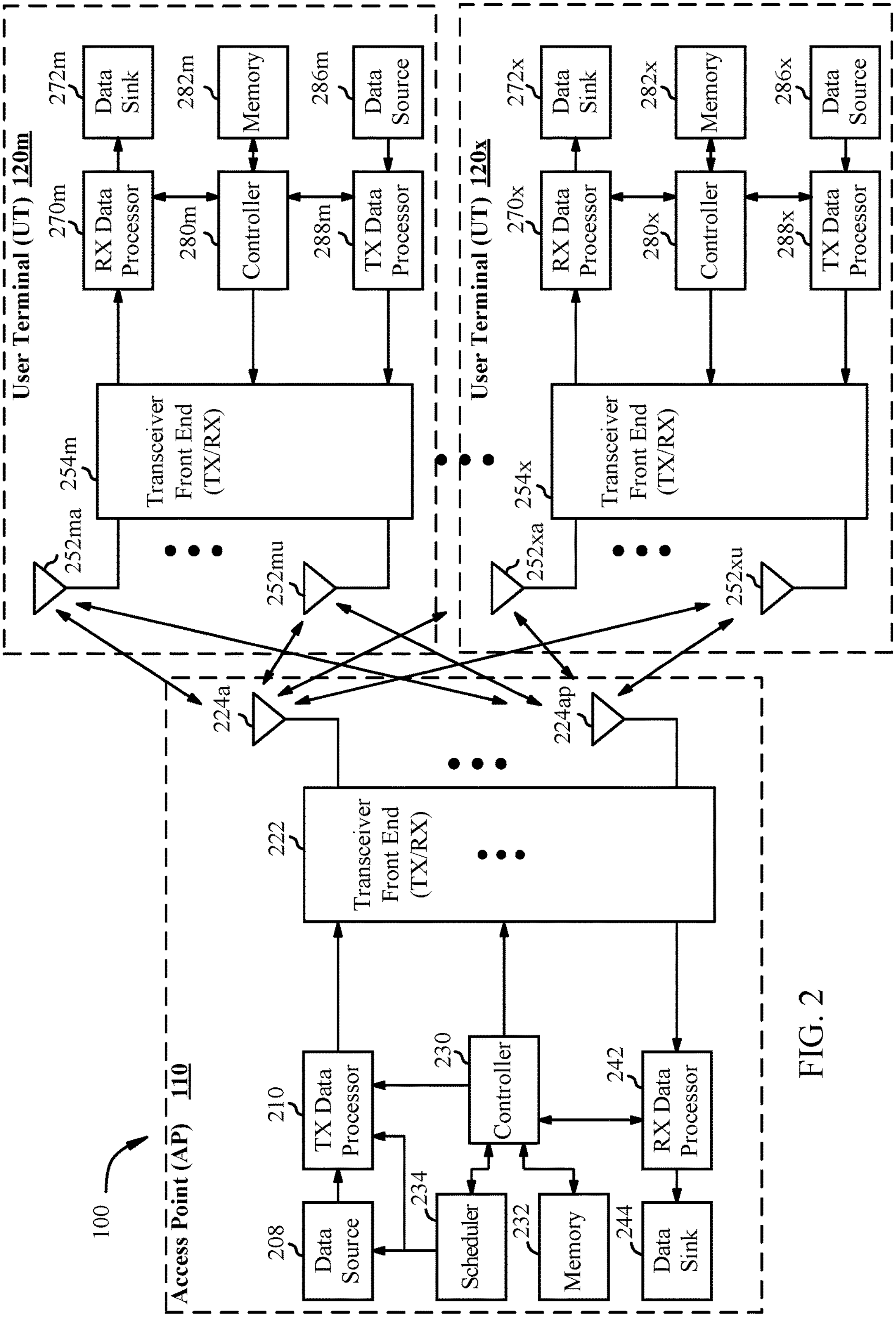
FIG. 2 is a block diagram of an example access point (AP) and example user terminals, in which aspects of the present disclosure may be practiced.

FIG. 2 shows a block diagram of access point 110 and two user terminals 120*m* and 120*x* in the wireless communications system 100. Access point 110 is equipped with $N_{ap}$ antennas 224*a* through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data {dup} for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224*a* through 224*ap* receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. Decoded data for each user terminal or access terminal may be provided to a data sink (e.g., data sink 244, data sink 272*m*, or data sink 272*x*) for storage and/or a controller for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

In some aspects, the transceiver front end 254 or 222 may include a frequency synthesizer implemented with an oscillator and a frequency doubler for generating an LO signal. The frequency doubler may be implemented with a step-symmetric inductive element, as described in more detail herein.

Figure 3:
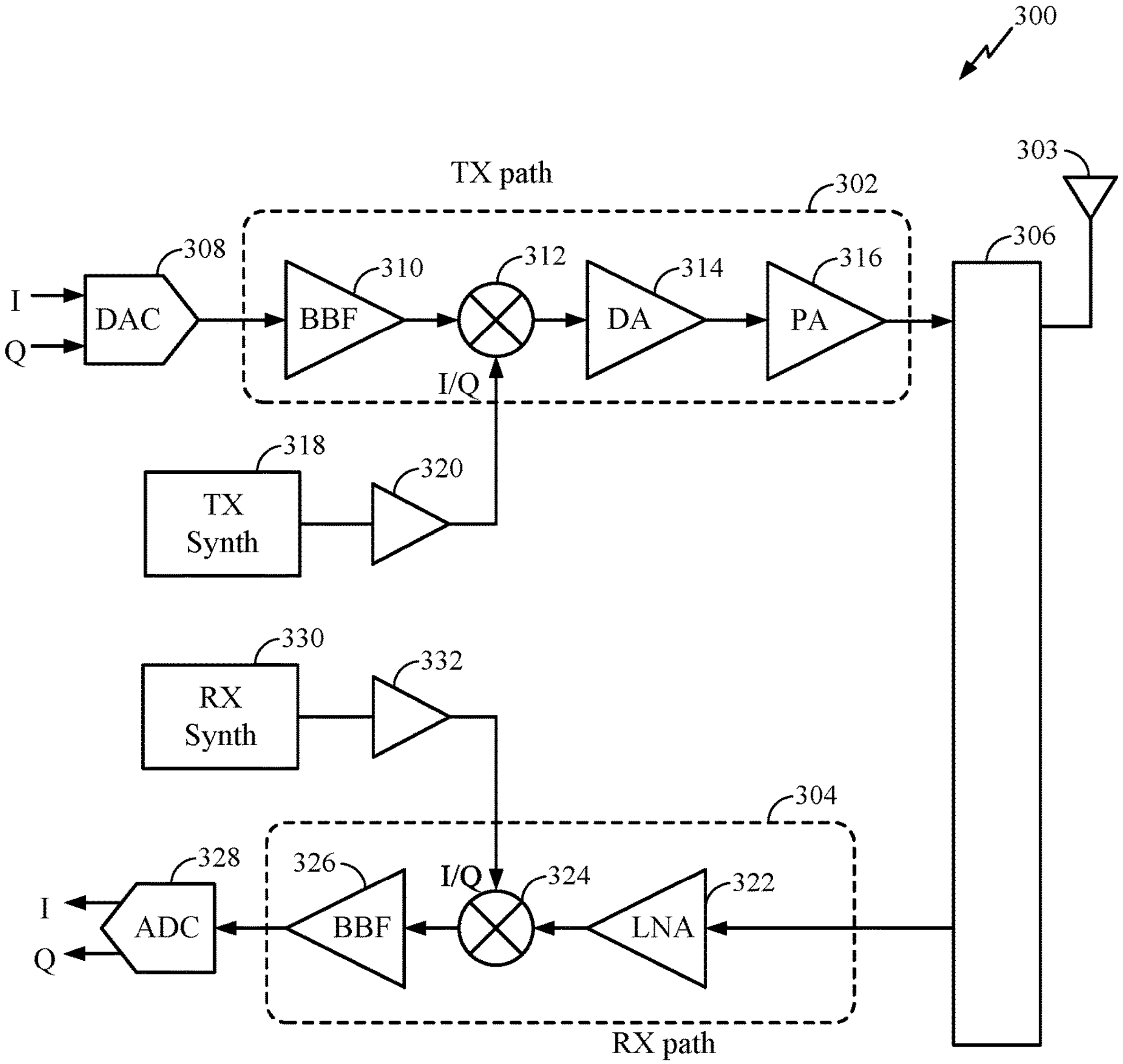
FIG. 3 is a block diagram of an example transceiver front end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a "transmit chain") for transmitting signals via one or more antennas and a receive (RX) path 304 (also known as a "receive chain") for receiving signals via the antennas. When the TX path 302 and the RX path 304 share an antenna 303, the paths may be connected with the antenna via an interface 306, which may include any of various suitable radio frequency (RF) devices, such as a switch, a duplexer, a diplexer, a multiplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC). In some cases, the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies of the LO frequency and the frequency of the signal of interest. The sum and difference frequencies are referred to as the "beat frequencies." The beat frequencies are typically in the RF range, such that the signals output by the mixer 312 are typically RF signals, which may be amplified by the DA 314 and/or by the PA 316 before transmission by the antenna 303. While one mixer 312 is illustrated, several mixers may be used to upconvert the filtered baseband signals to one or more intermediate frequencies and to thereafter upconvert the intermediate frequency (IF) signals to a frequency for transmission.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In some aspects, the RX frequency synthesizer 330 and/or the TX frequency synthesizer 318 may include an oscillator and a frequency doubler for generating an LO signal. The frequency doubler may be implemented with a step-symmetric inductive element, as described in more detail herein.

Example Techniques for Magnetic Field Cancellation for a Radio Architecture

In Internet of things (IoT) applications, it is typically desirable to lower the power consumption of the radio-frequency (RF) transceiver. It may be even more preferable to reduce the receiver (RX) power consumption because the receiver is active longer than the transmitter in the majority of IoT applications. When in active mode, a majority of the RX power may be consumed by the synthesizer and local-oscillator (LO) signal distribution. Therefore, it may be especially desirable to reduce the synthesizer and LO power consumption.

In some implementations, a zero-intermediate frequency (IF) transceiver may be used. A zero-IF transceiver refers to a transceiver that directly converts signals between a base-band (BB) frequency and RF frequency (e.g., without first converting to IF). Moreover, some zero-IF transceivers are implemented using a half-LO architecture. For example, a frequency synthesizer may be configured to generate a signal (e.g., referred to herein as a half-LO signal) at half the LO frequency, with a frequency doubler circuit being used to generate the LO signal (e.g., to be provided to a mixer for upconversion or downconversion) based on the half-LO signal. With the half-LO architecture, the voltage-controlled oscillator (VCO) of the frequency synthesizer may operate at half the LO frequency. Reducing the VCO frequency allows for a reduction in VCO and synthesizer power consumption. In this scheme, LO signal distribution may occur at half the LO frequency, saving power when driving the half-LO signal along relatively long LO transmission lines, compared to driving a distributed full-LO signal. The VCO operating at a half-LO frequency also reduces the transmission power consumption.

There are various LO architectures that may be used to design a zero-IF transceiver. Some of the challenges with the zero-IF transceiver and the half-LO architectures include power consumption, generation of spurs (e.g., harmonic signal components), and VCO or LO pulling (e.g., a change in VCO output frequency due to a change in the load on the VCO output). Certain aspects of the present disclosure are directed towards a transceiver architecture that addresses these challenges.

Figure 4:
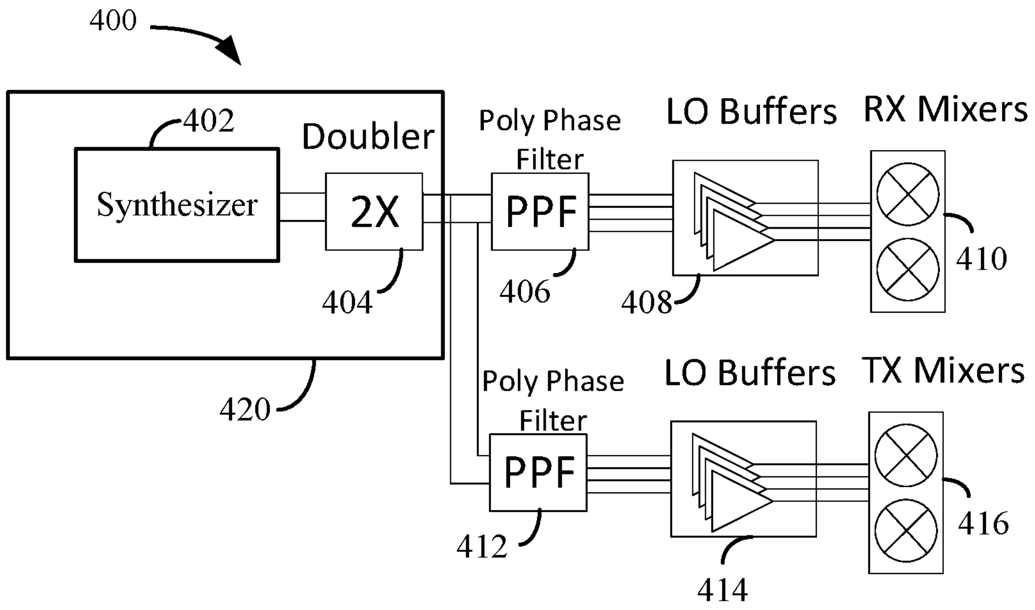
FIG. 4 is a block diagram illustrating an example frequency synthesizer architecture for a transceiver implemented with a frequency doubler circuit, in accordance with certain aspects of the present disclosure.

FIG. 4 illustrates a portion of an example transceiver 400 illustrating an example frequency synthesizer architecture, in accordance with certain aspects of the present disclosure. The transceiver 400 may include a synthesizer 402 (e.g., a phase-locked loop with a VCO), which may correspond to a portion of frequency synthesizer 318 or synthesizer 330 of FIG. 3. Synthesizer 402 may generate a half-LO signal (e.g., a 1.2 GHz signal for a 2.4 GHz operating mode or a 2.5 GHz signal for a 5 GHz operating mode). The half-LO signal may be provided to a frequency doubler circuit 404 (e.g., after being routed along a transmission line) to generate the LO signal (e.g., a 2.4 GHz signal or a 5 GHz signal). In some aspects, the synthesizer 402 and the frequency doubler circuit 404 implement a frequency synthesizer 420 such as the frequency synthesizer 318 or the frequency synthesizer 330 described with respect to FIG. 3. For reception, the generated LO signal may be provided to a poly-phase filter (PPF) 406 to generate phase-shifted LO signals (e.g., in-phase (I) and quadrature (Q) components). The phase-shifted LO signals may be provided to LO buffers 408 (e.g., corresponding to amplifier 332) before being provided to RX mixers 410 (e.g., corresponding to mixer 324) for down-conversion of received signaling in a receive chain (e.g., RX path 304). Similarly for transmission, the generated LO signal may be provided to a PPF 412 to generate phase-shifted LO signals (e.g., I and Q components), which may be provided to LO buffers 414 (e.g., corresponding to amplifier 320) and TX mixers 416 (e.g., corresponding to mixer 312) for upconversion of signaling for transmission in a transmit chain (e.g., TX path 302), as shown.

Figure 5:
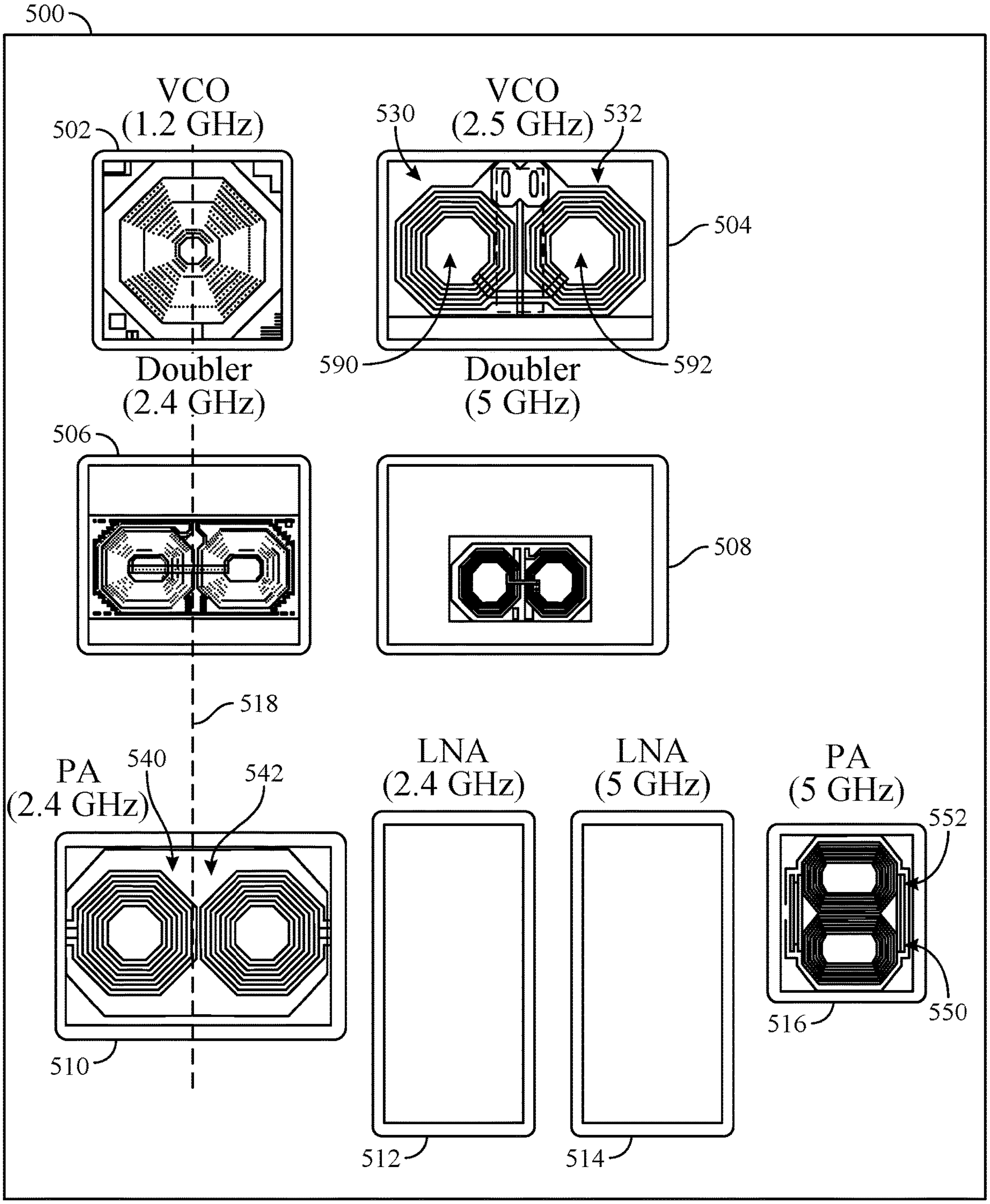
FIG. 5 illustrates the coils of an example transceiver including a frequency doubler circuit implemented with a step-symmetric inductive element, in accordance with certain aspects of the present disclosure.

FIG. 5 illustrates an example layout of coils in a transceiver 500, in accordance with certain aspects of the present disclosure. The transceiver 500 includes a VCO 502 for a 2.4 GHz band and a VCO 504 for a 5 GHz band. For example, the VCO 502 may generate a half-LO signal at 1.2 GHZ, which may be upconverted to generate a 2.4 GHZ LO signal using a frequency doubler 506. Similarly, the VCO 504 may generate a half-LO signal at 2.5 GHZ, which may be upconverted to a 5 GHZ LO signal using a frequency doubler 508. The output of the doubler 506 may be coupled to a TX mixer (e.g., TX mixers 416) for upconversion of BB signaling to be used for transmission via a 2.4 GHZ PA 510. Additionally or alternatively, the output of the doubler 506 may be provided to an RX mixer (e.g., RX mixers 410) for downconversion of received signaling amplified using a 2.4 GHz low-noise amplifier (LNA) 512. Similarly, the output of the doubler 508 may be coupled to a TX mixer for upconversion of BB signaling to be used for transmission via a 5 GHz PA 516, and/or provided to an RX mixer for downconversion of received signaling amplified using a 5 GHZ LNA 514.

For reception, one of the challenges with using a half-LO architecture is the generation of a direct-current (DC)-offset at the output of the downconverter (e.g., RX mixers) due to the magnetic fields from the LO signal coupling to the output of the LNA. In some cases, a DC offset cancellation (DCOC) circuit may be used to reduce the DC voltage offset. In some aspects of the present disclosure, the DC offset may be reduced by using a step-symmetric inductive element to implement the frequency doubler (e.g., frequency doubler 506 or frequency doubler 508). A step-symmetric inductive element refers to an inductive element including inductive portions (e.g., two coils) that are oriented in a same spiral (e.g., spirals that are in the same angular direction). For example, the inductive element may have a structure such that, at a point in time, current flows in a first portion of the inductive element in a first angular direction (e.g., clockwise direction) and flows in a second portion of the inductive element in a second opposite angular direction (e.g., counter-clockwise direction).

Figure 6:
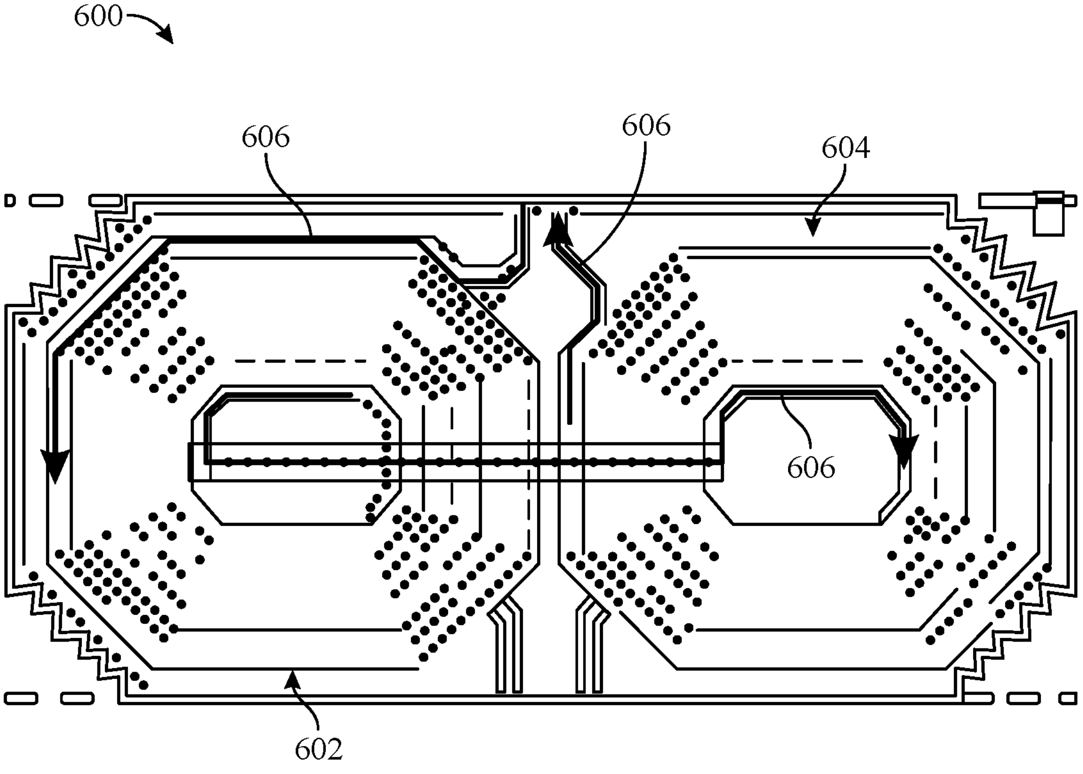
FIG. 6 illustrates an example inductive element implemented using step symmetry, in accordance with certain aspects of the present disclosure.

FIG. 6 illustrates an example inductive element 600 implemented using step symmetry, in accordance with certain aspects of the present disclosure. As shown, the inductive element 600 includes a first inductive portion 602 and a second inductive portion 604. The arrows 606 indicate the direction of current flow. As shown, the current flow in the first inductive portion 602 of the inductive element 600 is in the opposite angular direction than the current flow in the second inductive portion 604 of the inductive element 600. Therefore, the magnetic fields generated by the first inductive portion 602 are 180 degrees out of phase from the magnetic fields generated by the second inductive portion. Thus, the magnetic fields generated by the first inductive portion 602 at least partially cancel the magnetic fields generated by the second inductive portion 604.

Referring back to FIG. 5, the doubler 506 (or doubler 508) may be implemented using a step-symmetric inductive element. The magnetic fields from the frequency doubler are effectively canceled at the location of the LNA (e.g., at an inductive element of LNA 512), eliminating, or at least reducing, the DC offset described herein.

For transmission, the first harmonic of the output signal of the PA (e.g., PA 510 or PA 516) may couple to the inductor-capacitor (LC) tank circuit used to implement the doubler (e.g., doubler 506 or doubler 508). The LC tank circuit has a resonant frequency at the LO frequency ($f_{LO}$), creating a frequency offset at the PA output of twice the BB frequency ($f_{BB}$). As described herein, the doubler may be implemented with a step-symmetric inductive element that also reduces (e.g., rejects) the PA magnetic field, reducing the PA pulling of the LO.

The first harmonic of the output signal of the PA may still pull the VCO output signal (e.g., that is at half the LO frequency) through the second harmonic of the VCO. Thus, in some aspects of the present disclosure, the inductive element of the VCO may be configured to reject magnetic fields from the PA using a dual-core structure. For example, as shown, a first inductive portion 530 of the inductive element of VCO 504 may be wound around a first core 590, and a second inductive portion 532 of the inductive element of the VCO 504 may be wound around a second core 592. With the dual-core structure, the VCO inductive element is implemented with common-mode magnetic rejection, and the magnetic field from the PA (e.g., PA 516) at the output of the VCO 504 is rejected. In some aspects, the VCO 504 may also include circuitry for at least partially tuning out (e.g., canceling) the second harmonic at the output of the VCO 504. The second harmonic tuning reduces flicker noise at the output of the VCO and reduces VCO pulling.

In some aspects, an inductive element of the PA 510 may have an axis of symmetry aligned on axis 518 with the inductive element of the VCO 502, as shown. The inductive element of the PA 510 may have two inductive portions 540, 542. In some aspects, the two inductive portions 540, 542 may be coupled in series. Thus, given that the inductive element of the PA 510 has an inductance L, each inductive portion may have an inductance of L/2. The current flow in each of the inductive portions may be in opposite angular directions. Therefore, the magnetic field from one inductive portion (e.g., inductive portion 540) may be 180 degrees out of phase with the magnetic field from the other inductive portion (e.g., inductive portion 542), resulting in the magnetic fields at least partially canceling at the axis 518. With the inductive element of VCO 502 being aligned on axis 518, the magnetic interference from the PA 510 to the VCO 502 is reduced.

In some aspects, the PA 516 may include a dual-core transformer. The PA 516 may have an inductive element (e.g., a transformer winding) implemented with two inductive portions 550, 552. The inductive portion 550 may be wound around a first core, and the inductive portion 552 may be wound around a second core. In some aspects, the two inductive portions 550, 552 may be coupled in parallel. Thus, given that the inductive element has an inductance L, each inductive portion may have an inductance of 2×L. The current flow in each of the inductive portions may be in opposite angular directions. Therefore, the magnetic field from one inductive portion (e.g., inductive portion 550) may be 180 degrees out of phase with the magnetic field from the other inductive portion (e.g., inductive portion 552), further reducing magnetic emissions.

Figure 7:
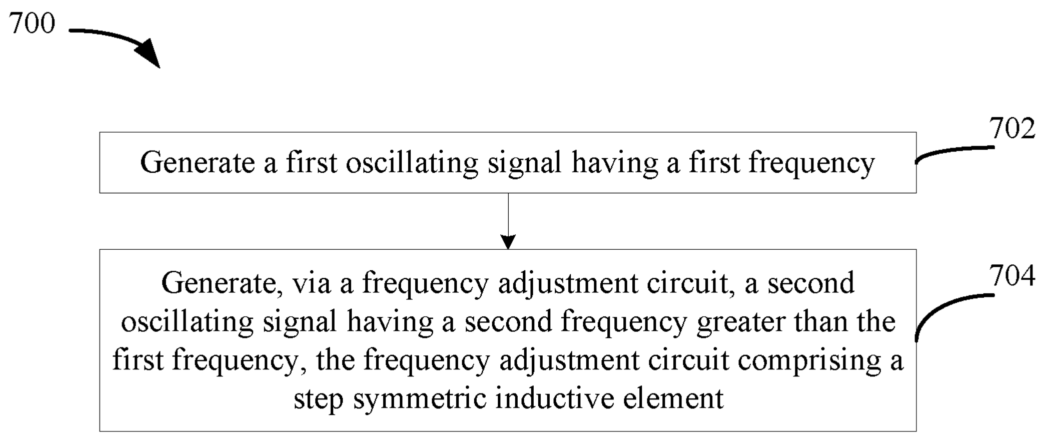
FIG. 7 is a flow diagram depicting example operations for wireless communication, in accordance with certain aspects of the present disclosure.

FIG. 7 is a flow diagram depicting example operations 700 for wireless communication, in accordance with certain aspects of the present disclosure. For example, the operations 700 may be performed by a frequency synthesizer such as the frequency synthesizer 420, and in some aspects, a transceiver, such as the transceiver 400 or 500.

The operations 700 begin, at block 702, with the frequency synthesizer generating (e.g., via VCO 502 or VCO 504) a first oscillating signal having a first frequency. At block 704, the frequency synthesizer generates, via a frequency adjustment circuit (e.g., frequency doubler 506 or frequency doubler 508), a second oscillating signal having a second frequency greater than the first frequency. In some aspects, the frequency adjustment circuit includes a step-symmetric inductive element. In some aspects, the frequency adjustment circuit includes a first inductive element having a first inductive portion and a second inductive portion. The first inductive portion and the second inductive portion may have a same spiral. Current may flow in the first inductive portion in a first angular direction and in the second inductive portion in a second angular direction opposite to the first angular direction.

In some aspects, the oscillator (e.g., VCO 504) includes an inductive element having a first inductive portion (e.g., inductive portion 530) and a second inductive portion (e.g., inductive portion 532). The first inductive portion may be wound around a first core (e.g., core 590), and the second inductive portion may be wound around a second core (e.g., core 592).

In some aspects, the frequency synthesizer may be part of a transceiver. The transceiver may generate, via a mixer (e.g., RX mixers 410 or TX mixers 416), a mixed signal based on the second oscillating signal to be processed for signal reception or to be amplified for signal transmission. For example, the mixed signal may be a baseband signal to be provided to a baseband processor, or may be an RF signal to be amplified via an amplifier (e.g., PA 510 or PA 516) for transmission via an antenna.

In some aspects, the amplifier (e.g., PA 516) includes a transformer having a winding. A first portion (e.g., inductive portion 550) of the winding may be wound around a first core, and a second portion (e.g., inductive portion 552) of the winding may be wound around a second core. In some aspects, the amplifier (e.g., PA 510) includes a first inductive element having a first inductive portion (e.g., inductive portion 540) and a second inductive portion (e.g., inductive portion 542). The first inductive portion may be disposed adjacent to a first side of an axis (e.g., axis 518) bisecting the first inductive element, and the second inductive portion may be disposed adjacent to a second side of the axis. The axis may be an axis of symmetry associated with the first inductive element (e.g., inductive element of PA 510) and a second inductive element of the VCO (e.g., VCO 502). The first inductive portion and the second inductive portion may have a same spiral. Current may flow in the first inductive portion in a first angular direction and in the second inductive portion in a second angular direction opposite to the first angular direction.

EXAMPLE ASPECTS

In addition to the various aspects described above, specific combinations of aspects are within the scope of the disclosure, some of which are detailed below:

Aspect 1. A transceiver, comprising: an oscillator; and a frequency adjustment circuit, an output of the oscillator being coupled to an input of the frequency adjustment circuit, the frequency adjustment circuit comprising a step-symmetric inductive element.

Aspect 2. The transceiver of aspect 1, wherein the transceiver further comprises: a mixer having a local-oscillator (LO) input coupled to an output of the frequency adjustment circuit; and an amplifier coupled to the mixer.

Aspect 3. The transceiver of any one of aspects 1-2, wherein the oscillator is a voltage-controlled oscillator (VCO).

Aspect 4. The transceiver of any one of aspects 1-3, wherein the oscillator is configured to generate a half local-oscillator (LO) signal having a frequency that is half a LO frequency of the transceiver and wherein the frequency adjustment circuit comprises a frequency doubler configured to generate an LO signal based on the half LO signal.

Aspect 5. The transceiver of any one of aspects 1-4, wherein the step-symmetric inductive element has a first inductive portion and a second inductive portion and wherein current is configured to flow in the first inductive portion in a first angular direction and in the second inductive portion in a second angular direction opposite to the first angular direction.

Aspect 6. The transceiver of any one of aspects 1-5, wherein the step-symmetric inductive element includes a first inductive portion and a second inductive portion and wherein the first inductive portion and the second inductive portion are oriented with a same spiral.

Aspect 7. The transceiver of any one of aspects 1-6, wherein the oscillator comprises an inductive element having a first inductive portion and a second inductive portion, wherein the first inductive portion is wound around a first core, and wherein the second inductive portion is wound around a second core.

Aspect 8. The transceiver of any one of aspects 1-7, wherein the oscillator comprises a dual-core structure.

Aspect 9. The transceiver of any one of aspects 1-8, further comprising an amplifier coupled to an output of the frequency adjustment circuit, wherein the amplifier comprises a transformer having a winding, wherein a first portion of the winding is wound around a first core, and wherein a second portion of the winding is wound around a second core.

Aspect 10. The transceiver of any one of aspects 1-9, further comprising an amplifier coupled to an output of the frequency adjustment circuit, wherein the amplifier comprises a dual-core transformer.

Aspect 11. The transceiver of any one of aspects 1-10, further comprising an amplifier coupled to an output of the frequency adjustment circuit, wherein the amplifier comprises a first inductive element having a first inductive portion and a second inductive portion, wherein the first inductive portion is disposed adjacent to a first side of an axis bisecting the first inductive element, and wherein the second inductive portion is disposed adjacent to a second side of the axis.

Aspect 12. The transceiver of aspect 11, wherein current is configured to flow in the first inductive portion in a first angular direction and in the second inductive portion in a second angular direction opposite to the first angular direction.

Aspect 13. The transceiver of any one of aspects 11-12, wherein the oscillator comprises a second inductive element disposed on the axis.

Aspect 14. The transceiver of any one of aspects 11-13, wherein the axis comprises an axis of symmetry associated with the first inductive element and a second inductive element of the oscillator.

Aspect 15. The transceiver of any one of aspects 1-14, further comprising an amplifier coupled to an output of the frequency adjustment circuit, wherein the amplifier comprises a power amplifier (PA).

Aspect 16. The transceiver of any one of aspects 1-15, further comprising an amplifier coupled to an output of the frequency adjustment circuit, wherein the amplifier comprises a low-noise amplifier (LNA).

Aspect 17. A frequency synthesizer, comprising: an oscillator; and a frequency adjustment circuit, an output of the oscillator being coupled to an input of the frequency adjustment circuit, the frequency adjustment circuit comprising a step-symmetric inductive element.

Aspect 18. The frequency synthesizer of aspect 17, wherein the step-symmetric inductive element has a first inductive portion and a second inductive portion and wherein current is configured to flow in the first inductive portion in a first angular direction and in the second inductive portion in a second angular direction opposite to the first angular direction.

Aspect 19. The frequency synthesizer of any one of aspects 17-18, wherein the step-symmetric inductive element includes a first inductive portion and a second inductive portion, wherein the first inductive portion and the second inductive portion are oriented with a same spiral.

Aspect 20. The frequency synthesizer of any one of aspects 17-19, further comprising an amplifier coupled to an output of the frequency adjustment circuit, wherein the amplifier comprises a first inductive element having a first inductive portion and a second inductive portion, wherein the first inductive portion is disposed adjacent to a first side of an axis bisecting the first inductive element, and wherein the second inductive portion is disposed adjacent to a second side of the axis.

Aspect 21. The frequency synthesizer of any one of aspects 17-20, wherein the oscillator is a voltage-controlled oscillator (VCO).

Aspect 22. A transceiver, comprising: an oscillator; and a frequency adjustment circuit, an output of the oscillator being coupled to an input of the frequency adjustment circuit, the frequency adjustment circuit comprising a first inductive element having a first inductive portion and a second inductive portion, wherein current is configured to flow in the first inductive portion in a first angular direction and in the second inductive portion in a second angular direction opposite to the first angular direction.

Aspect 23. The transceiver of aspect 22, further comprising: a mixer having a local-oscillator (LO) input coupled to an output of the frequency adjustment circuit; and an amplifier coupled to the mixer.

Aspect 24. The transceiver of any one of aspects 22-23, wherein the oscillator comprises a second inductive element having a first inductive portion and a second inductive portion, wherein the first inductive portion is wound around a first core, and wherein the second inductive portion is would around a second core.

Aspect 25. The transceiver of any one of aspects 22-24, further comprising an amplifier coupled to an output of the frequency adjustment circuit, wherein the amplifier comprises a transformer having a winding, wherein a first portion of the winding is wound around a first core, and wherein a second portion of the winding is wound around a second core.

Aspect 26. The transceiver of any one of aspects 22-25, further comprising an amplifier coupled to an output of the frequency adjustment circuit, wherein the amplifier comprises a second inductive element having a first inductive portion and a second inductive portion, wherein the first inductive portion is disposed adjacent to a first side of an axis bisecting the second inductive element, and wherein the second inductive portion is disposed adjacent to a second side of the axis.

Aspect 27. The transceiver of aspect 26, wherein the axis comprises an axis of symmetry associated with the second inductive element.

Aspect 28. The transceiver of any one of aspects 26-27, wherein current is configured to flow in the first inductive portion in a first angular direction and in the second inductive portion in a second angular direction opposite to the first angular direction.

Aspect 29. A method for wireless communication, comprising: generating a first oscillating signal having a first frequency; and generating, via a frequency adjustment circuit, a second oscillating signal having a second frequency greater than the first frequency, the frequency adjustment circuit comprising a step-symmetric inductive element.

Aspect 30. The method of aspect 29, further comprising: generating, via a mixer, a mixed signal based on the second oscillating signal to be processed for signal reception or to be amplified for signal transmission.

ADDITIONAL CONSIDERATIONS

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The apparatus and methods described in the detailed description are illustrated in the accompanying drawings by various blocks, modules, components, circuits, steps, processes, algorithms, etc. (collectively referred to as "elements"). The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112 (f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A transceiver, comprising:

an oscillator; and a frequency adjustment circuit, an output of the oscillator being coupled to an input of the frequency adjustment circuit, the frequency adjustment circuit comprising a step-symmetric inductive element, wherein the step-symmetric inductive element has a first inductive portion and a second inductive portion, and wherein a same current is configured to flow in the first inductive portion and in the second inductive portion.

2. The transceiver of claim 1, wherein the transceiver further comprises:

a mixer having a local-oscillator (LO) input coupled to an output of the frequency adjustment circuit; and an amplifier coupled to the mixer.

3. The transceiver of claim 1, wherein the oscillator is a voltage-controlled oscillator (VCO).

4. The transceiver of claim 1, wherein the oscillator is configured to generate a half local-oscillator (LO) signal having a frequency that is half a LO frequency of the transceiver and wherein the frequency adjustment circuit comprises a frequency doubler configured to generate an LO signal based on the half LO signal.

5. The transceiver of claim 1, wherein the same current is configured to flow in the first inductive portion in a first angular direction and in the second inductive portion in a second angular direction opposite to the first angular direction.

6. The transceiver of claim 1, wherein the first inductive portion and the second inductive portion are oriented with a same spiral.

7. The transceiver of claim 1, wherein the oscillator comprises an inductive element having a first inductive portion and a second inductive portion, wherein the first inductive portion of the inductive element is wound around a first core, and wherein the second inductive portion of the inductive element is wound around a second core.

8. The transceiver of claim 1, wherein the oscillator comprises a dual-core structure.

9. The transceiver of claim 1, further comprising an amplifier coupled to an output of the frequency adjustment circuit, wherein the amplifier comprises a transformer having a winding, wherein a first portion of the winding is wound around a first core, and wherein a second portion of the winding is wound around a second core.

10. The transceiver of claim 1, further comprising an amplifier coupled to an output of the frequency adjustment circuit, wherein the amplifier comprises a dual-core transformer.

11. The transceiver of claim 1, further comprising an amplifier coupled to an output of the frequency adjustment circuit, wherein the amplifier comprises a first inductive element having a first inductive portion and a second inductive portion, wherein the first inductive portion of the first inductive element is disposed adjacent to a first side of an axis bisecting the first inductive element, and wherein the second inductive portion of the first inductive element is disposed adjacent to a second side of the axis.

12. The transceiver of claim 11, wherein current is configured to flow in the first inductive portion of the first inductive element in a first angular direction and in the second inductive portion of the first inductive element in a second angular direction opposite to the first angular direction.

13. The transceiver of claim 11, wherein the oscillator comprises a tank circuit including a second inductive element disposed on the axis.

14. The transceiver of claim 11, wherein the axis comprises an axis of symmetry associated with the first inductive element and a second inductive element of a tank circuit of the oscillator.

15. The transceiver of claim 1, further comprising an amplifier coupled to an output of the frequency adjustment circuit, wherein the amplifier comprises a power amplifier (PA).

16. The transceiver of claim 1, further comprising an amplifier coupled to an output of the frequency adjustment circuit, wherein the amplifier comprises a low-noise amplifier (LNA).

17. A frequency synthesizer, comprising:

an oscillator; and a frequency adjustment circuit, an output of the oscillator being coupled to an input of the frequency adjustment circuit, the frequency adjustment circuit comprising a step-symmetric inductive element, wherein the step-symmetric inductive element has a first inductive portion and a second inductive portion, and wherein a same current is configured to flow in the first inductive portion and in the second inductive portion.

18. The frequency synthesizer of claim 17, the same current is configured to flow in the first inductive portion in a first angular direction and in the second inductive portion in a second angular direction opposite to the first angular direction.

19. The frequency synthesizer of claim 17, the first inductive portion and the second inductive portion are oriented with a same spiral.

20. The frequency synthesizer of claim 17, further comprising an amplifier coupled to an output of the frequency adjustment circuit, wherein the amplifier comprises a first inductive element having a first inductive portion and a second inductive portion, wherein the first inductive portion of the first inductive element is disposed adjacent to a first side of an axis bisecting the first inductive element, and wherein the second inductive portion of the first inductive element is disposed adjacent to a second side of the axis.

21. The frequency synthesizer of claim 17, wherein the oscillator is a voltage-controlled oscillator (VCO).

22. A method for wireless communication, comprising:

generating a first oscillating signal having a first frequency; and generating, via a frequency adjustment circuit, a second oscillating signal having a second frequency greater than the first frequency, the frequency adjustment circuit comprising a step-symmetric inductive element, wherein the step-symmetric inductive element has a first inductive portion and a second inductive portion, and wherein a same current flows in the first inductive portion and in the second inductive portion to generate the second oscillating signal.

23. The method of claim 22, further comprising:

generating, via a mixer, a mixed signal based on the second oscillating signal to be processed for signal reception or to be amplified for signal transmission.

* * * * *